United States Patent [19]

Tsunoda et al.

[11] 4,424,325

[45] Jan. 3, 1984

[54] PHOTOSENSITIVE MATERIAL

[75] Inventors: Takahiro Tsunoda; Tsuguo Yamaoka, both of Funabashi; Sinji Tamura, Suita, all of Japan

[73] Assignee: Daikin Kogyo Co., Ltd., Osaka, Japan

[21] Appl. No.: 265,571

[22] Filed: May 20, 1981

[30] Foreign Application Priority Data

May 27, 1980 [JP] Japan ................................. 55-71164

[51] Int. Cl.³ .......................................... C08F 214/18
[52] U.S. Cl. ................................ 526/245; 204/159.14; 526/243; 526/244; 526/246; 526/247; 526/248; 526/253
[58] Field of Search .................. 204/159.14; 526/243, 526/244, 245, 246, 247, 248, 253

[56] References Cited

U.S. PATENT DOCUMENTS

| 3,637,614 | 1/1972 | Greenwood | 526/245 |
|---|---|---|---|
| 3,645,989 | 2/1972 | Tandy | 526/245 |
| 3,882,084 | 5/1975 | Tato et al. | 526/245 |
| 4,007,043 | 2/1977 | Stolka et al. | 526/245 |
| 4,125,672 | 11/1978 | Kakuchi et al. | 428/421 |
| 4,143,225 | 3/1979 | Turner | 526/244 |
| 4,171,417 | 10/1979 | Dixon | 526/245 |

OTHER PUBLICATIONS

Kobunshi Ronbunshi, vol. 35, No. 5, pp. 331-337 (May 1978) Kenichi Koseki et al.
Kobunshi Ronbunshi, vol. 37, No. 4, pp. 235-241 (Apr. 1980) Kenichi Koseki et al.

Primary Examiner—Harry Wong, Jr.
Attorney, Agent, or Firm—Armstrong, Nikaido, Marmelstein & Kubovcik

[57] ABSTRACT

A copolymer comprising (a) a monomer having a $C_7$ to $C_{21}$ perfluoroalkyl or perfluoroalkenyl group at one end of the molecule and an ethylenically unsaturated group at the other end of the molecule, and (b) a monomer having a photosensitive group, e.g. an azidobenzoyloxy group, cinnamoyloxy group, benzoylphenyl group or $\alpha,\beta$-unsaturated ketone group. The copolymer has an excellent photosensitivity and excellent water and oil repellent properties, and is useful for various purposes, e.g. as a photosensitive material for dry offset printing plate or resist and as a photo-curable, water and oil repelling coating material.

3 Claims, No Drawings

PHOTOSENSITIVE MATERIAL

BACKGROUND OF THE INVENTION

The present invention relates to a novel photosensitive material and its use, and more particularly to a novel photosensitive fluorine-containing copolymer and a dry offset printing plate using it as a photosensitive layer.

A fluoroalkyl acrylate copolymer is hiterto known to be useful as a water and oil repelling agent for fibers. In recent years, it is attempted to use a fluoroalkyl acrylate homopolymer or copolymer as a material of an offset printing plate, as proposed in Japanese Unexamined Patent Publication (Tokkyo Kokai) No. 74404/1977 in which a film of the homopolymer or copolymer is formed on a support such as aluminum plate to provide an offset ink repelling layer. In such an offset printing plate, an oleophilic image area for carrying an offset ink thereon is formed on the layer by handwriting letters or pictures with an oleophilic ink such as marking ink, ball pen or carbon ink or by typewriting them. In another printing plate, an oleophilic photoconductive layer is further provided between the support and the ink repelling layer, and an oleophilic image area is formed by imagewise perforating the ink repelling layer with electric discharge or by forming a toner image on the ink repelling layer in a usual electrophotographic manner. However, these offset printing plates do not provide a sufficiently resolved image and, therefore, the image is lacking in resolving power or sharpness. These plates also have the disadvantage that the printing durability is not sufficient because the adhesive property of the ink repelling layer is poor in the imaged portion.

It is an object of the present invention to provide a fluorine-containing copolymer useful as a photosensitive material.

A further object of the present invention is to provide a dry offset printing plate which can form an image of good resolving power in a simple manner and moreover has an excellent printing durability.

These and other objects of the present invention will become apparent from the description hereinafter.

SUMMARY OF THE INVENTION

In accordance with the present invention, there is provided a copolymer comprising (a) units of a monomer having a $C_7$ to $C_{21}$ perfluoroalkyl or perfluoroalkenyl group at one end of the molecule, an ethylenically unsaturated group at the other end of the molecule, and a bivalent group containing $-(CH_2)_n-$ group in which n is an integer of 1 to 10 and linking the both end groups, and (b) units of an ethylenically unsaturated monomer having a photosensitive group.

The copolymer of the present invention is sensitive to light, and can be cured by exposure to light so as to become insoluble in an organic soluvent. The copolymer also has an excellent oil repellent property, and accordingly is veryl useful as a photosensitive material for dry offset printing plate.

DETAILED DESCRIPTION

In the present invention, there is employed as a monomer (a) a compound of the following general formula (I):

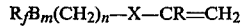

$$R_fB_m(CH_2)_n-X-CR=CH_2 \qquad (I)$$

wherein $R_f$ is a perfluoroalkyl or perfluoroalkenyl group having 7 to 21 carbon atoms, B is a bivalent group linking the $R_f$ group and $-(CH_2)_n-$ group, R is hydrogen atom or methyl group, X is a single bond or a bivalent group such as $-O-$, $-OCO-$, $-COO-$, $-NHCO-$ or $-CO-$, m is 0 or 1, and n is an integer of 1 to 10.

Ethylenically unsaturated end-groups as shown by the formula $-X-CR=CH_2$ in the above formula (I) include, for instance, $-CH=CH_2$, $-OCH=CH_2$, $-OCOC(CH_3)=CH_2$, $-COOCH=CH_2$, $-NHCOCH=CH_2$ and $-COCH=CH_2$, but are not limited to them.

Bivalent groups containing $-(CH_2)_n-$ group and linking the both $R_f$ and $-X-CR=CH_2$ end-groups, as shown by the formula $-B_m(CH_2)_n-$ in the above formula (I), include, for instance, $-(CH_2)_n-$, $-CO(CH_2)_n-$, $-SO_2(CH_2)_n-$, $-O(CH_2)_n-$, $-(CH_2)_3-O(CH_2)_n-$, $-S(CH_2)_n-$, $-(CH_2)_p-NR^1(CH_2)_n-$, $-CO-NR^1(CH_2)_n-$, $-SO_2-NR^1(CH_2)_n-$,

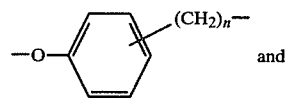

and

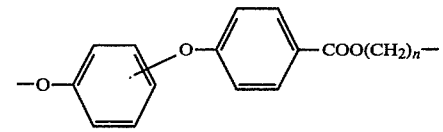

wherein n is as defined above, $R^1$ is hydrogen atom or an alkyl group having 1 to 5 carbon atoms, and p is an integer of 1 to 6.

The perfluoroalkyl or perfluoroalkenyl end-groups $R_f$ may be those having a straight-chain structure, a branched-chain structure, a ring structure or a combined structure thereof.

Preferable monomer (a) employed in the present invention is a compound of the following general formula (Ia):

$$R_fB_m(CH_2)_nOCOCR=CH_2 \qquad (Ia)$$

wherein $R_f$, B, R, m and n are as defined above. The bivalent groups B linking the $R_f$ group and $-(CH_2)_n-$ group include, for instance, $-CO-$, $-SO_2-$, $-O-$, $-(CH_2)_3-O-$, $-S-$, $-(CH_2)_p-NR^1-$, $-CO-NR^1-$, $-SO_2-NR^1-$,

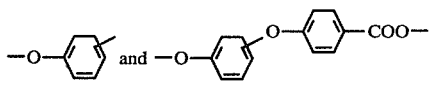

wherein $R^1$ and p are as defined above.

Typical examples of the acrylate and methacrylate monomers (a) shown by the above general formula (Ia) are 2-perfluoroisononylethyl methacrylate of the formula:

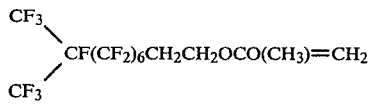

2-perfluorooctylethyl methacrylate of the formula:

$$C_8F_{17}CH_2CH_2OCOC(CH_3)=CH_2$$

2-perfluorodecylethyl methacrylate of the formula:

$$C_{10}F_{21}CH_2CH_2OCOC(CH_3)=CH_2$$

2-(N-ethyl-perfluorooctanesulfonamide)ethyl acrylate of the formula:

$$C_8F_{17}SO_2N(C_2H_5)CH_2CH_2OCOCH=CH_2$$

2-(N-propyl-perfluorooctanesulfonamide)ethyl acrylate of the formula:

$$C_8F_{17}SO_2N(C_3H_7)CH_2CH_2OCOCH=CH_2$$

2-(N-methyl-perfluorooctanesulfonamide)ethyl acrylate of the formula:

$$C_8F_{17}SO_2N(CH_3)CH_2CH_2OCOCH=CH_2$$

perfluorononenyloxybenzyloxyethyl methacrylate of the formula:

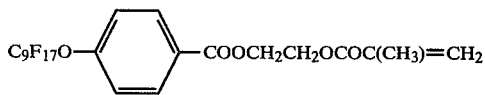

and perfluorododecenyloxybenzyloxyethyl methacrylate of the formula:

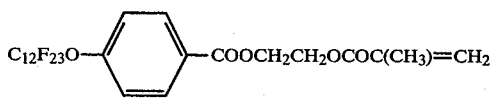

Known acrylates and methacrylates of the following general formula (II):

$$R_f^1(CH_2)_nOCOCR=CH_2 \qquad (II)$$

wherein $R_f^1$ is a straight or branched perfluoroalkyl group having 7 to 21 carbon atoms, and R and n are as defined above, are preferably employed as a monomer (a) in the present invention. In particular, perfluorooctylethyl methacrylate of the formula:

$$C_8F_{17}CH_2CH_2OCOC(CH_3)=CH_2$$

and 2-perfluoroisononylethyl methacrylate of the formula:

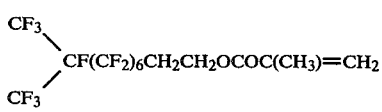

are preferred.

Ethylenically unsaturated monomers having a photosensitive group are employed in the present invention as a monomer (b) to be copolymerized with the monomer (a). The photosensitive groups of the monomer (b) include, for instance, azidobenzoyloxy groups of the following general formula (1):

wherein Y is hydrogen atom, an alkyl group having 1 to 5 carbon atoms, an alkoxyl group having 1 to 5 carbon atoms, nitro group, chlorine atom or bromine atom, cinnamic acid residue of the formula (2):

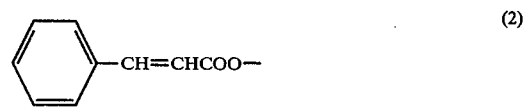

benzoylphenyl group of the formula (3):

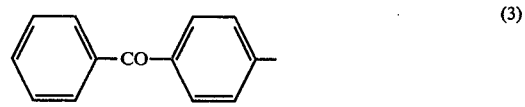

and groups containing $\alpha,\beta$-unsaturated ketone group of the formula (4):

$$-COCH=CH- \qquad (4)$$

but the photosensitive groups are not limited to them. The photosensitive group attaches directly or through a bivalent group to an ethylenically unsaturated group, e.g. acryloyloxy group, methacryloyloxy group, acryloylamino group, methacryloylamino group, vinyl ether group, α-methylvinyl group, or the like. The bivalent group linking the photosensitive group to the ethylenically unsaturated group is not limited to specific groups, and may be general bivalent organic groups, e.g. a bivalent hydrocarbon group and a bivalent monosubstituted hydrocarbon group with hydroxyl group, a halogen atom except fluorine such as chlorine or bromine, unless it has an effect particularly on the both functional groups. Preferably, the carbon number of the above unsubstituted or substituted hydrocarbon group is from 1 to 5, especially from 1 to 3.

Preferable monomers (b) having the azidobenzoyloxy group (1) are compounds of the following general formula (III):

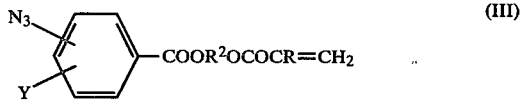

wherein R and Y are as defined above and $R^2$ is a bivalent organic group. The azido group may be attached to any of ortho, meta and para positions of the benzene ring, and the para position is particularly preferred. Typical examples of the compound (III) are mentioned below.

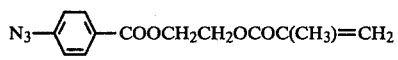

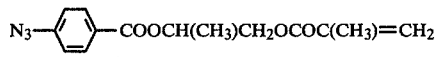

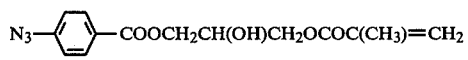

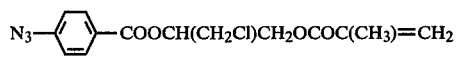

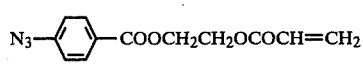

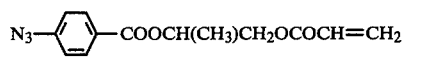

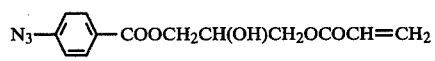

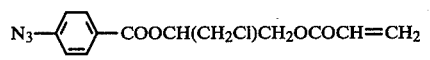

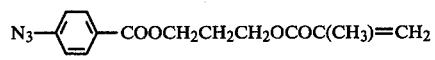

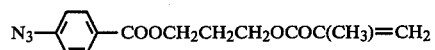

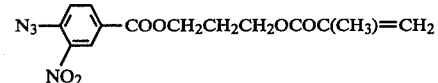

Preferable monomers (b) having cinnamic acid residue (2) are compounds of the following general formula (IV):

wherein R and $R^2$ are as defined above. Typical examples of the compound (IV) are mentioned below.

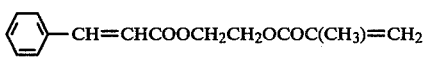

Preferable monomers (b) having benzoylphenyl group (3) are compounds of the following general formulas (Va), (Vb) and (Vc):

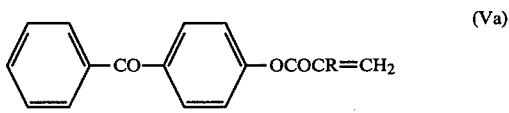

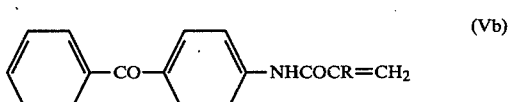

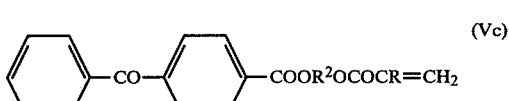

wherein R and $R^2$ are as defined above. Typical examples of these compounds are mentioned below.

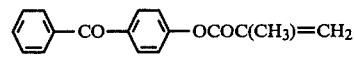

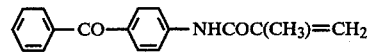

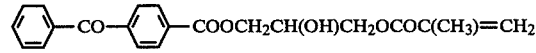

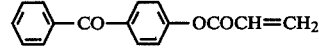

The photosensitive groups containing the $\alpha,\beta$-unsaturated ketone group (4) include, for instance, cinnamoylphenyl group of the formula:

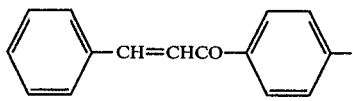

benzoylvinylphenyl group of the formula:

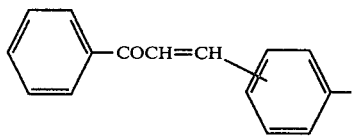

2'-methoxy-4'-(1-buten-3-onyl)-phenyl group of the formula:

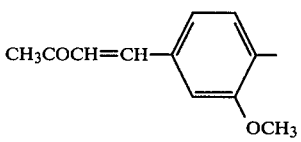

benzoylvinylbenzoyloxy group of the formula:

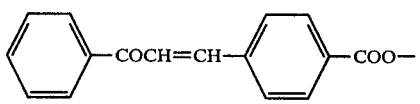

cinnamoyl groups of the following general formula (5):

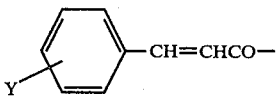

(5)

wherein Y is as defined above.

Preferable monomers (b) containing the α,β-unsaturated ketone group (4) are compounds of the following general formulas (VIa), (VIb) and (VIc):

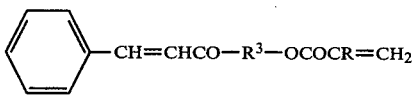 (VIa)

wherein R is hydrogen atom or methyl group, and $R^3$ is

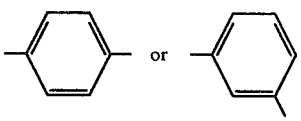

$R^4$—COCH=CH—$R^5$—OCOCR=CH$_2$ (VIb)

wherein R is as defined above, $R^4$ is methyl, ethyl or phenyl and $R^5$ is

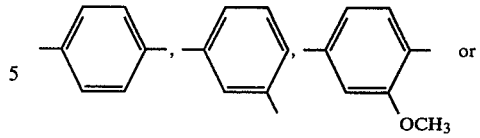

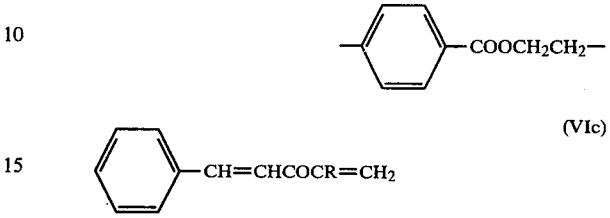

(VIc)

wherein R is as defined above, an unsaturated ketone of the formula:

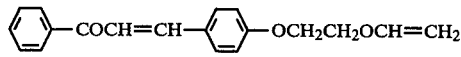

and an unsaturated ketone of the formula:

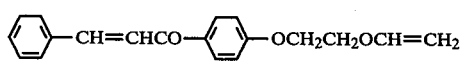

Typical examples of the monomer (b) having the α,β-unsaturated ketone group are mentioned below:

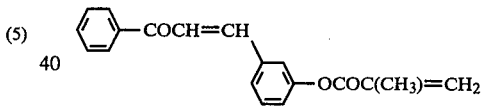

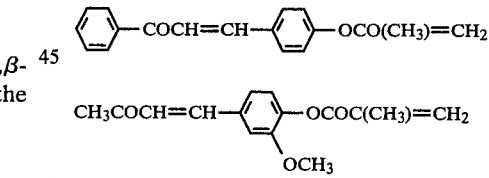

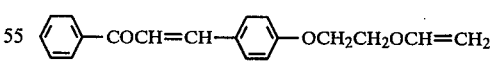

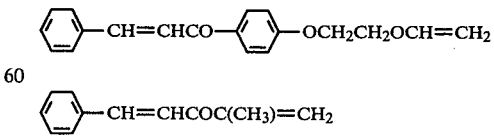

The copolymer of the present invention may be composed only of the above-mentioned monomers (a) and (b), or may contain at most 75% by mole of other vinyl monomer units. The vinyl monomers copolymerized with the monomers (a) and (b) include, for instance, an ethylenically unsaturated olefin such as ethylene, propylene, butylene, isobutylene or butadiene, a styrene compound such as styrene, α-methylstyrene or p-chlorostyrene, an unsaturated carboxylic acid such as acrylic acid, methacrylic acid, itaconic acid, maleic acid or maleic anhydride, an α-methylene aliphatic monocarboxylic acid ester such as methyl acrylate, ethyl acrylate, n-butyl acrylate, isobutyl acrylate, dodecyl acrylate, n-octyl acrylate, 2-chloroethyl acrylate, phenyl acrylate, methyl α-chloroacrylate, methyl methacrylate, ethyl methacrylate, butyl methacrylate or ethyl α-ethylacrylate, a vinyl ether such as vinyl methyl ether, vinyl ethyl ether or vinyl isobutyl ether, a vinyl halide such as vinyl chloride, a vinyl ester such as vinyl acetate, vinyl propionate, vinyl butyrate or vinyl benzoate, an ethylene derivative such as 1-methyl-1'-methoxyethylene, 1,1-dimethoxyethylene, 1,1'-dimethoxyethylene, 1,1'-dimethoxycarbonylethylene or 1-methyl-1'-nitroethylene, a N-vinyl compound such as N-vinylpyrrole, N-vinylcarbazole, N-vinylindole, N-vinylpyrrlidine or N-vinylpyrrolidone, acrylonitrile, methacrylonitrile, acrylamide, methacrylamide, α-ethylacrylamide, acrylic acid anilide, p-chloroacrylic acid anilide, m-nitroacrylic acid anilide, m-methoxyacrylic acid anilide, vinylidene chloride and vinylidene cyanide.

The copolymer of the present invention is prepared by copolymerizing the monomers (a) and (b) or copolymerizing the monomers (a) and (b) and the above-mentioned other vinyl monomer. The polymerization is usually carried out by a solution polymerization or emulsion polymerization process, and particularly the solution polymerization is preferable, since the copolymer having more excellent solubility and sensitivity is obtained.

As a solvent in the solution polymerization, there is used a good solvent for the produced copolymer such as m-xylene hexafluoride, trichlorotrifluoroethane, tetrachlorohexafluorobutane, or dimer and trimer of hexafluoropropene.

Peroxides and aliphatic azo compounds used in a usual solution polymerization may be used as a polymerization initiator, and particularly azoisobutyronitrile and benzoyl peroxide are preferable. Also, the polymerization temperature is preferably from 45° to 70° C.

It is preferable that the copolymer of the present invention contains at least 20% by mole, especially at least 40% by mole, of the monomer (a) units and at least 5% by mole, especially at least 10% by mole, of the monomer (b) units. When the content of the monomer (a) units is less than 20% by mole, the copolymer is poor in oil ink-repellent property and is unsuitable for use in dry offset printing plate. When the content of the monomer (b) units is less than 5% by mole, the copolymer is poor in photosensitivity and cannot form a satisfactory image by exposure to light.

The copolymer of the present invention has an excellent sensitivity to light and also has water-repellent and oil-repellent properties, and can be availably employed in various purposes.

The copolymer of the present invention is very useful as a photosensitive material, particularly for dry offset printing plate. The copolymer is supported in the form of film on a support to provide a dry offset printing plate. An image can be easily formed, for instance, by bringing a positive film into close contact with a photosensitive layer of the printing plate, exposing to light such as ultraviolet rays and developing with a solvent.

The photosensitive layer (repellent layers) of the printing plate is formed by preparing a solution of the copolymer in an organic solvent, if necessary, to which a sensitizer may be added, coating uniformly the solution onto a support and drying it. The thickness of the photosensitive layer, is, for instance, from 2 to 20 μm. As a support, there is used, for instance, metal plates such as aluminum plate, zinc plate and iron plate, papers, and plastic films having a good dimensional stability such as polyester film.

Usual graphic arts light sources such as a high pressure mercury lamp and a xenon lamp are employed as a light source for the exposure of the photosensitive layer. The development is conducted by dissolving the unexposed area with an organic solvent as mentioned before, and whereby the surface of the support at the unexposed area appeares and the exposed area remains undissolved to leave as an image because the polymer is cured. The thus formed image strongly repels an oil printing ink, and accordingly provides a practical offset printing plate which can be used without dampening water.

The offset printing plate of the present invention has the advantages (1) that plate making procedure is simple, (2) that the adhesiveness between the cured portion and a support and the mechanical strength of the cured portion are excellent, and (3) that the cured portion has a good repellent property to an oil ink. Therefore, the imaged printing plate does not require the use of dampening water in printing and also has excellent sharpness and printing durability.

The copolymer of the present invention are useful for other purposes as well as dry offset printing plate. By utilizing an excellent photosensitivity, it is possible to provide paper and other substrates with a photo-curable coating, and for instance, by further utilizing the water and oil repellent properties, the copolymer can be employed as a water and oil repelling coating. The copolymer is also usable as a resist for producing a negative fine pattern by exposure to X-rays, electron beams or far ultraviolet rays.

The present invention is more particularly described and explained by means of the following Examples.

EXAMPLE 1

(1) Preparation of 2-cinnamoyloxyethyl methacrylate

In 46 g. of pyridine was dissolved 19 g. of 2-hydroxyethyl methacrylate, and 25 g. of cinnamic acid chloride was gradually added to the solution with vigorously sitrring and cooling the reaction vessel with ice-cold water. After the addition, the reaction was continued for 8 hours at room temperature. The reaction mixture wad poured into 200 ml. of water, and the separated liquid was extracted with ether. The ether layer was dried with anhydrous sodium sulfate and filtered, and ether was then removed under reduced pressure to give 33 g. of 2-cinnamoyloxyethyl methacrylate in the form of light yellow liquid. The identification was conducted by elemental analysis, infrared spectrum and nuclear magnetic resonance spectrum.

(2) Preparation of copolymer

A 200 ml. glass ampule was charged with the following mixture.

| | |
|---|---|
| m-Xylene hexafluoride | 100 ml. |
| Perfluorooctylethyl methacrylate | 0.035 mole |

-continued

| | |
|---|---|
| [C$_8$F$_{17}$CH$_2$CH$_2$OCOC(CH$_3$)=CH$_2$] | |
| 2-Cinnamoyloxyethyl methacrylate | 0.015 mole |
| α,α'-Azobisisobutyronitrile | 0.1 g. |
| (hereinafter referred to as "AIBN") | |

The mixture was frozen by liquid nitrogen, and after degassing for 30 minutes by a vacuum pump, was fused at room temperature. These freezing, degassing and fusing procedures were conducted twice, and after freezing the mixture and degassing for 30 minutes again, the ampule was sealed.

After fusing the frozen mixture in the ampule at room temperature, the ampule was placed in an oil bath and the polymerization was carried out at 60° C. for 4.5 hours. After the polymerization, the mixture was added to n-hexane with agitation, and the precipitate was filtered with a glass filter and washed with n-hexane and dried under reduced pressure at room temperature.

The obtained precipitate was subjected to infrared spectrum analysis. The infrared spectrum indicated the absorption based on the carbonyl group of perfluorooctylethyl methacrylate at 1,740 cm.$^{-1}$ and the absorption based on the ethylenically unsaturated group of cinnamoyl group at 1,665 cm.$^{-1}$

EXAMPLE 2

A copolymer was prepared in the same manner as in Example 1 except that the following mixture was employed for the polymerization.

| | |
|---|---|
| m-Xylene hexafluoride | 100 ml. |
| Perfluorooctylethyl methacrylate | 0.035 mole |
| p-Azidobenzoyloxyethyl methacrylate | 0.015 mole |
| AIBN | 0.1 g. |

The infrared spectrum of the obtained polymer indicated the absorption based on the carbonyl group of perfluorooctylethyl methacrylate at 1,740 cm.$^{-1}$ and the absorption based on the carbonyl group of p-azidobenzoic acid of p-azidobenzoyloxyethyl methacrylate at 1,720 cm.$^{-1}$

EXAMPLE 3

A copolymer was prepared in the same manner as in Example 1 except that the following mixture was employed for the polymerization.

| | |
|---|---|
| m-Xylene hexafluoride | 100 ml. |
| Perfluorooctylethyl methacrylate | 0.035 mole |
| p-Benzoylphenyl acrylate | 0.015 mole |
| AIBN | 0.1 g. |

The infrared spectrum of the obtained polymer indicated the absorption based on the carbonyl group of perfluorooctylethyl methacrylate at 1,740 cm.$^{-1}$ and the absorption based on the stretching vibration of diaryl ketone at 1,660 cm.$^{-1}$

EXAMPLE 4

A copolymer was prepared in the same manner as in Example 1 except that the following mixture was employed for the polymerization.

| | |
|---|---|
| m-Xylene hexafluoride | 100 ml. |
| 2-Perfluoroisononylethyl methacrylate | 0.035 mole |

-continued

| | |
|---|---|
| CF$_3$\\<br>　　＼<br>　　　CF(CF$_2$)$_6$CH$_2$CH$_2$OCOC(CH$_3$)=CH$_2$<br>　　／<br>CF$_3$／ | |
| Cinnamoylphenyl methacrylate | 0.015 mole |
| ⟨　⟩—CH=CHCO—⟨　⟩—OCOC(CH$_3$)=CH$_2$ | |
| AIBN | 0.1 g. |

The infrared spectrum of the obtained polymer indicated the absorption based on the carbonyl group of 2-perfluoroisononylethyl methacrylate at 1,740 cm.$^{-1}$ and the absorption based on the cinnamoylphenyl group at 1,650 cm.$^{-1}$

EXAMPLE 5

A copolymer was prepared in the same manner as in Example 1 except that the following mixture was employed for the polymerization.

| | |
|---|---|
| m-Xylene hexafluoride | 100 ml. |
| Perfluorooctylethyl methacrylate | 0.030 mole |
| 2-Hydroxyethyl methacrylate | 0.005 mole |
| p-Azidobenzoyloxyethyl methacrylate | 0.015 mole |
| AIBN | 0.1 g. |

The infrared spectrum of the obtained polymer indicated the absorption based on the carbonyl group of perfluorooctylethyl methacrylate at 1,740 cm.$^{-1}$, the absorption based on the carbonyl group of p-azidobenzoic acid of p-azidobenzoyloxyethyl methacrylate at 1,720 cm.$^{-1}$ and the absorption based on the hydroxyl group of 2-hydroxyethyl methacrylate at 3,400 cm.$^{-1}$

EXAMPLE 6

A photosensitive coating solution was prepared according to the following formulation.

| Component | Amount |
|---|---|
| m-Xylene hexafluoride (solvent) | 100 ml. |
| Copolymer obtained in Example 1 (photosensitive material) | 5 g. |
| 5-Nitroacenaphthene (sensitizer) | 0.25 g. |

The solution was applied to the smooth surface of an aluminum plate by a spin coater at 200 r.p.m., and was dried to give a film having a thickness of 2 μm. A positive film of halftone image of 150 lines/inch was superposed on the coated surface of the thus obtained photosensitive plate, and the plate was exposed to light from a 20 W chemical lamp for 5 minutes at a distance of 10 cm. Development was then conducted with m-xylene hexafluoride to dissolve and remove the unexposed area, thereby causing the aluminum surface to appear. The plate was then attached to an offset printing machine from which a roll for feeding dampening water was detached, and printing was carried out without dampening water by employing a usual offset ink. The ink stuck to only the exposing aluminum surface without sticking to the polymer film portion of the plate. The printing was continued until 20,000 sheets of printed matters are produced. The quality of the later impression was the same as that of the first impression, and 5 to 95% halftone dots of 150 lines/inch was completely reproduced.

EXAMPLES 7 TO 10

The procedures of Example 6 were repeated except that the copolymers obtained in Examples 2 to 5 were employed as photosensitive materials to produce 20,000 sheets of printed matters in respective printing tests. No change in quality of the 20,000 sheets obtained in each printing test was observed.

What we claim is:

1. A copolymer comprising:

at most 75% by mole of a vinyl monomer copolymerizable with monomers (a) and (b), as defined below;

at least 20% by mole of a monomer (a) having a perfluoroalkyl group or perfluoroalkenyl group at one end of the monomer and an ethylenically unsaturated group selected from the group consisting of acryloyloxy, methacryloyloxy, acryloylamino, methacryloylamino, vinyl ether and α-methylvinyl, at the other end of the monomer; a bivalent group containing —(CH$_2$)$_n$— linking the both end groups, monomer (a) is a compound having the following general formula (I):

$$R_fB_m(CH_2)_n-X-CR=CH_2 \quad (I)$$

in which $R_f$ is a perfluoroalkyl group or perfluoroalkenyl group having 7 to 21 carbon atoms; B is a bivalent group linking the $R_f$ group and the —(CH$_2$)$_n$— group selected from the group consisting of —CO—, —SO$_2$—, —O—, —(CH$_2$)$_3$—O—, —S—, —(CH$_2$)$_p$—NR$^1$—, —CO—NR$^1$—, —SO$_2$—NR$^1$—, —O—⟨phenyl⟩— , and —O—⟨phenyl⟩—O—⟨phenyl⟩—COO—, wherein R$^1$ is a hydrogen atom or an alkyl group having 1 to 5 carbon atoms, and p is an integer of 1 to 6; R is hydrogen or methyl group; X is a single bond or a bivalent group selected from the group consisting of —O—, —OCO—, —COO—, —NH-CO— and —CO—; m is 0 or 1; and n is an integer of 1 to 10; and at least 5% by mole of an ethylenically unsaturated monomer (b) having a photosensitive group, wherein the photosensitive group is a member selected from the group consisting of:

an azidobenzoyloxy group of the formula (1):

N$_3$—⟨phenyl-Y⟩—COO— (1)

in which Y is hydrogen, an alkyl group having 1 to 5 carbon atoms, an alkoxyl group having 1 to 5 carbon atoms, nitro group, chlorine or bromine, a cinnamic acid residue of the formula (2):

⟨phenyl⟩—COO— (2)

a benzoylphenyl group of the formula (3):

⟨phenyl⟩—CO—⟨phenyl⟩— (3)

and a group containing an α,β-unsaturated ketone of the formula (4):

—COCH=CH— (4)

the photosensitive group containing the α,β-unsaturated ketone of formula (4) being selected from the group consisting of cinnamoylphenyl group of the formula:

⟨phenyl⟩—CH=CHCO—⟨phenyl⟩—, benzoylvinylphenyl group of the formula:

⟨phenyl⟩—COCH=CH—⟨phenyl⟩—,

2'-methoxy-4'-(1-buten-3-onyl)-phenyl group of the formula:

CH$_3$—COCH=CH—⟨phenyl-OCH$_3$⟩—, benzoylvinylbenzoyloxy group of the formula:

⟨phenyl⟩—COCH=CH—⟨phenyl⟩—COO— and a cinnamoyl group of the general formula:

⟨phenyl-Y⟩—CH=CHCO— in which Y is as defined above.

2. The copolymer of claim 1, wherein the compound of the general formula (I) is a compound of the following general formula (Ia):

$$R_fB_m(CH_2)_nOCOCR=CH_2 \quad (Ia)$$

wherein $R_f$, B, R, m and n are as defined above.

3. The copolymer of claim 1, wherein the compound of the general formula (I) is a compound of the following general formula (II):

$$R_f^1(CH_2)_nOCOCR=CH_2 \quad (II)$$

wherein $R_f^1$ is a straight or branched perfluoroalkyl group having 7 to 21 carbon atoms, and R and n are as defined above.

* * * * *